United States Patent [19]
Groth, Jr.

[11] 4,229,741
[45] Oct. 21, 1980

[54] TWO-WAY COMMUNICATIONS SYSTEM AND METHOD OF SYNCHRONIZING

[75] Inventor: Edward J. Groth, Jr., Scottsdale, Ariz.

[73] Assignee: Motorola, Inc.

[21] Appl. No.: 19,378

[22] Filed: Mar. 12, 1979

[51] Int. Cl.² ............................................. H04J 5/14
[52] U.S. Cl. ..................................... 370/24; 178/69.6; 370/100; 375/24
[58] Field of Search ................ 343/179, 180, 181; 325/17, 20, 25, 31; 179/15 BC, 15 BA, 15 BS; 178/69.1

[56] References Cited
U.S. PATENT DOCUMENTS

| | | | |
|---|---|---|---|
| 3,546,701 | 12/1970 | Kurth | 343/179 |
| 3,550,134 | 12/1970 | Kurth | 343/179 |
| 3,795,772 | 3/1974 | Hill | 179/15 BC |
| 3,825,830 | 7/1974 | O'Connor | 343/181 |
| 4,019,138 | 4/1977 | Watanabe | 325/17 |
| 4,053,889 | 10/1977 | Johnson | 343/17.2 PC |
| 4,075,427 | 2/1978 | Matisson | 179/15 BC |

*Primary Examiner*—David L. Stewart
*Attorney, Agent, or Firm*—Eugene A. Parsons

[57] ABSTRACT

A control unit and a remote unit each including a transmitter and receiver with the remote unit transmitter and control unit receiver being synchronized first by means of a variable oscillator in the control unit and connected to the receiver in a closed loop, and the transmitter of the control unit and receiver of the remote unit being synchronized second by sensing errors between a received signal and the operating frequency of the receiver in the remote unit and transmitting the error signal back to the control unit by way of the previously synchronized transmitter/receiver for controlling the frequency of the transmitter in the control unit.

10 Claims, 1 Drawing Figure

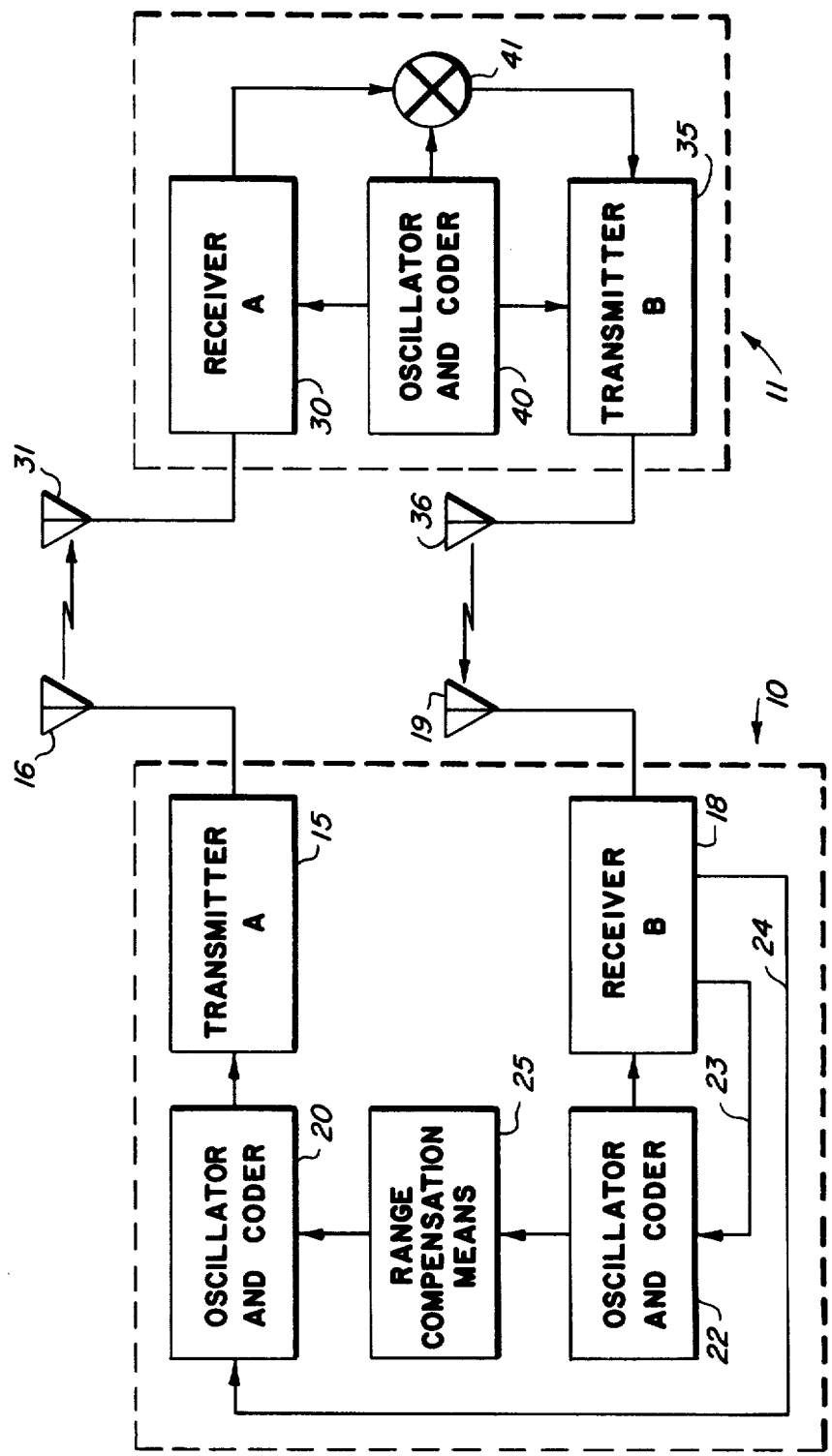

TWO-WAY COMMUNICATIONS SYSTEM AND METHOD OF SYNCHRONIZING

BACKGROUND OF THE INVENTION

The present invention pertains to two-way communications systems, such as might be utilized between an airplane and a guided missile, or similar circumstances. Generally, in this type of system a control unit includes a transmitter and receiver and a remote unit includes a transmitter and receiver with the receiver of the remote unit being designed to lock onto the transmitter of the control unit and the receiver of the control unit being designed to lock onto the transmitter of the remote unit. When the remote unit is located on a missile or projectile approaching a target, jamming signals from the target may be strong enough to make it difficult for the remote receiver to recognize and lock onto a transmitted signal from the control unit. Further, it is essential that the two transmitter/receiver loops be locked or synchronized in the shortest possible time.

SUMMARY OF THE INVENTION

The present invention pertains to a two-way communications system and method wherein a control unit and a remote unit each have a transmitter and receiver, the control unit receiver locks onto a transmission from the remote unit by varying a variable oscillator in the control unit, the control unit transmitter then sends a signal to the remote unit which senses the error between the operating frequency and/or phase (or timing) of the remote unit receiver and the control unit transmitter and transmits the error back to the control unit receiver which adjusts a variable oscillator of the control unit transmitter to synchronize the control unit transmitter and the remote unit receiver.

In addition, the remote unit transmitter and receiver are operated from a common fixed frequency local oscillator so that synchronization of the control unit receiver with the remote unit transmitter provides a direct indication of the remote unit receiver operating frequency. Thus, the time required for synchronization or lock-up of the control transmitter-remote receiver link, needing only compensation for range delays, can be greatly reduced.

It is an object of the present invention to provide a new and improved two-way communications system.

It is a further object of the present invention to provide a new and improved two-way communications system which can be synchronized substantially faster than prior art systems and which is less susceptible to jamming.

These and other objects of this invention will become apparent to those skilled in the art upon consideration of the accompanying specification, claims and drawing.

BRIEF DESCRIPTION OF THE DRAWING

The single FIGURE is a simplified block diagram of a two-way communications system embodying the present invention.

DESCRIPTION OF THE PREFERRED EMBODIMENT

Referring to the drawing, the numeral 10 generally designates a control unit and the numeral 11 generally designates a remote unit. The control unit 10 may be located, for example, on an airplane or other similar base and the remote unit 11 may be, for example, located on a missile or the like, which is being controlled or otherwise communicated with from the airplane.

The control unit 10 includes a transmitter 15 having an antenna 16 connected thereto and a receiver 18 having an antenna 19 connected thereto. In many instances a single antenna will be utilized in place of two separate antennas. An oscillator and coder 20 is connected to the transmitter 15 for supplying signals at the proper operating frequency thereto. The oscillator and coder circuit 20 actually forms a portion of the transmitter 15 and is illustrated separately for purposes of explanation of this invention. The oscillator and coder circuit 20, in conjunction with the remainder of the transmitter circuit 15 cooperate to transmit a spread spectrum signal. Spread spectrum signals are well known and understood in the art, but a typical transmitter/oscillator and coder which might be utilized in the present embodiment is illustrated in U.S. Pat. No. 4,053,889, entitled "Non-Linear Spread Spectrum Transmitter/Receiver For a Homing System", issued Oct. 11, 1977.

An oscillator coder circuit 22 is connected to the receiver 18 and actually forms a part thereof, but is separated in this disclosure to facilitate explanation thereof. The oscillator coder circuit 22 operates to compress received spread spectrum signals, as is well known in the art and as is explained in the above described U.S. Patent. A feedback line 23 from the receiver 18 to the oscillator and coder circuit 22 denotes a closed loop for controlling the frequency and/or phase of the oscillator in the oscillator and coder circuit 22. A feedback line 24 from the receiver 18 to the oscillator and coder circuit 20 supplies frequency and/or phase control signals from the receiver 18 to the oscillator of the oscillator and coder circuit 20. Both oscillators in the oscillator and coder circuits 20 and 22 are variable and may be, for example, voltage controlled oscillators (VCO) typically used in phase locked loops and the like wherein the oscillator is controlled or maintained at a desired frequency and/or phase by an error signal. It should be understood that control of frequency may involve control of phase or timing as required by the detailed implementation. Although control of frequency is generally employed throughout the discussion, it should be understood that control of phase or timing is or may be included wherever frequency control is mentioned or discussed. The oscillator and coder circuit 22 is connected to the oscillator and coder circuit 20 through range compensation means 25.

The remote unit 11 includes a receiver 30 having an antenna 31 attached thereto and a transmitter 35 having an antenna 36 attached thereto. In this instance also, a single antenna may be substituted for two separate antennas. A single oscillator and coder circuit 40 supplies signals at the proper operating frequencies to both the receiver 30 and the transmitter 35. An output of the receiver 30 and an output of the oscillator and coder circuit 40 are also applied to a phase comparator, illustrated as a simple mixer 41, the output of which is connected to the transmitter 35. The oscillator and coder circuit 40 operates in conjunction with the oscillator and coder circuits 20 and 22 of the control unit 10 to properly compress signals received by the receiver 30 and expand signals transmitted by the transmitter 35. Further, while a single oscillator is utilized in the oscillator and coder circuit 40 it should be understood that the receiver 30 and transmitter 35 do not necessarily operate at the same frequency since doublers and other circuits may be included in the oscillator and coder circuit 40 to provide the proper separation between the operating frequencies of the receiver 30 and the transmitter 35 for two-way communications. A typical transmitter/receiver system utilizing a single oscillator is disclosed in U.S. Pat. No. 3,825,830, entitled "Offset Oscillator System For Radio Transmitter and Receiver", issued July 23, 1974. While the system disclosed in the above described patent is relatively complex, the patent does explain some of the considerations for such a system. However, it should be understood that the present system is generally designed as simple as possible since in many cases the remote unit may be non-retrievable, or disposable. Further, while a single oscillator and coder circuit 40 is illustrated for the remote unit 11, it should be understood that two oscillator circuits might be utilized if desired and the present circuit is illustrated only for advantages which will be described presently.

In the operation of the present system, the transmitter 35 of the remote unit 11 is activated first. The transmitter 35 may be initially activated by means of a timer, a response to a predetermined condition, continuous operation, etc. The signal transmitted by the transmitter 35 is received by receiver 18 in the control unit 10 and the oscillator and coder circuit 22 are controlled into synchronization with the signal by means of the closed loop 23. Synchronization of the operating frequency and/or phase of a receiver to a received transmission is well known in the art and need not be explained in detail in this disclosure.

Once the receiver 18 and transmitter 35 are synchronized, an output from the oscillator and coder circuit 22 is applied through the range compensation means 25 to the oscillator and coder circuit 20 to aid in providing quick synchronization of the transmitter 15 and receiver 30. Since the receiver 18 is synchronized with the transmitter 35, the operating frequency of the oscillator in the oscillator and coder circuit 40 of the remote unit 11 is known to within oscillator frequency drift errors, and the approximate operating frequency of the oscillator and the phase or timing of the coder circuit 20 can be preset by a signal from the range compensation means 25. However, since the remote unit 11 is spaced from the control unit 10 the exact operating phase difference or timing of the oscillator in the circuit 40 will differ from the operating phase difference or timing of the oscillator in the circuit 22 by an amount equal to the time required for the signal to travel from the transmitter 35 to the receiver 18. If the distance between the control unit 10 and the remote unit 11 is known or can be estimated, a delay can be introduced into the signal from the circuit 22 by range compensation means 25. The oscillator in the circuit 20 must be adjusted so that the operating frequency of the transmitter 15 is synchronized with the operating frequency of the receiver 30. It should be noted that a second transmission delay, similar to the transmission delay between the transmitter 35 and receiver 18, will be experienced between the signal transmitted from transmitter 15 to receiver 30. Therefore, the phase of time advance introduced by the range compensation means 25 to equalize the delays must be twice the transmission time from remote unit 11 to control unit 10 to bring the oscillator and coder circuit 20 into approximate synchronization. It should also be noted that the connection between the circuit 22 and the circuit 20 through the range compensation means 25 is a feature incorporated to greatly reduce the amount of time required to synchronize the entire system, but proper synchronization and complete operation of the basic invention can be obtained without this circuit.

Once the transmitter 15 is activated and the signal is received by receiver 30, the frequency and/or phase of the incoming signal is compared to the operating frequency and/or phase of the oscillator 40 in the circuit 41, which may be a phase detector, comparator, mixer, etc. The circuit 41 produces an error signal indicative of the difference in frequency and/or phase between the two signals, which error signal is supplied to the transmitter 35 for transmission back to the receiver 18. The error signal is received by the receiver 18 and supplied to the oscillator and coder circuit 20 by way of the line 24. The error signal on the line 24 will control the oscillator and coder circuit 20, and transmitter 15, into synchronization with the receiver 30. If the range compensation means 25 is incorporated in the circuit the operating time advance of the circuit 20 will be close to that required and the error signal on the line 24 will quickly bring the system into synchronization. If the range compensation means 25 is not included in the circuit, the error signal on the line 24 will still bring the system into synchronization but additional time may be required because the oscillator in the circuit 20 may be much further from synchronization.

Thus, the sequence of operation is to synchronize the receiver 18 with the transmitter 35 first and then synchronize the transmitter 15 with the receiver 30. It should be noted that both links are synchronized at the control unit 10. Further, if the remote unit 11 is located in a projectile, missile, or the like, it will be much closer to a target or the like and, therefore, jamming signals eminating from the target will be at a much higher level in the area of the remote unit 11. Since the jamming signals will be at a much lower level adjacent the control unit 10, it will be much less susceptible to the jamming signals and synchronizing a link from the transmitter 35 to the receiver 18, initially, will be much easier than attempting to synchronize a link from the control unit 10 to the remote unit 11. Because of this difference in interference levels, the receiver 18 can be a much broader band unit than the receiver 30, which will aid in reducing the time required for synchronization. Since the circuit 20 can be controlled to approximate synchronization prior to operation of the second link (transmitter 15 and receiver 30) the receiver 30 can have a relatively narrow bandwidth without substantially affecting the time required for obtaining synchronization. The narrow bandwidth can be exploited to provide better jam resistance on the link more threatened by jamming.

Thus, a two-way communications system is disclosed which provides substantial advantages in the time for synchronization. The remote unit is simplified, which makes it less expensive and more dispensible. Also, all search and synchronization activites occur in the control unit which, in some embodiments, allows the search conditions to be observed and decisions to be made, if desired. While I have shown and described a specific embodiment of this invention, further modification and improvements will occur to those skilled in the art. I desire it to be understood, therefore, that this invention is not limited to the particular form shown and I intend in the appended claims to cover all modifications which do not depart from the spirit and scope of this invention.

I claim:

1. A two-way communications system including a control unit and a remote unit, said system comprising:

(a) a transmitter and a receiver in the remote unit with means for sensing errors in frequency between signals received by said remote unit receiver and the operating frequency of said remote unit receiver, and coupling the sensed errors to the remote unit transmitter for transmission thereby;

(b) a receiver in the control unit approximately tuned to receive transmissions from said remote unit transmitter and including variable local oscillator means connected to said control unit receiver in a closed loop for synchronizing the operating frequency of the control unit receiver with the frequency of the remote unit transmitter; and (c) a transmitter in the control unit having variable local oscillator means coupled thereto and connected to receive transmitted error signals from said control unit receiver for controlling the frequency of operation of said control unit transmitter so that signals transmitted to said remote unit receiver by said control unit transmitter will be synchronized with the remote unit local oscillator means.

2. A two-way communications system as claimed in claim 1 wherein the remote unit transmitter and receiver are operated from common fixed frequency local oscillator means.

3. A two-way communications system as claimed in claim 1 including means coupled to the control unit receiver and transmitter for introducing time advancements approximately equal to delays in transmission due to the range between the remote and the control units.

4. A two-way communications system as claimed in claim 1 wherein the means for sensing errors in the remote unit includes a phase detector.

5. A two-way communications system as claimed in claim 1 wherein the control unit receiver is relatively wide band and the remote unit receiver is relatively narrow band.

6. A two-way communications system as claimed in claim 1 wherein signals transmitted between the transmitters and the receivers of the control and remote units are spread spectrum signals.

7. In a two-way communications system including a control unit and a remote unit, each having a transmitter and a receiver, a method of synchronizing the remote unit transmitter and the control unit receiver, and the remote unit receiver and the control unit transmitter comprising the steps of:

(a) transmitting a signal from the remote unit transmitter to the control unit receiver;

(b) adjusting the operating frequency of the control unit receiver into synchronism with the signal from the remote unit transmitter;

(c) transmitting a signal from the control unit transmitter to the remote unit receiver;

(d) measuring the error in synchronism between the frequency of the signal received from the control unit transmitter and the operating frequency of the remote unit receiver and supplying the error to the remote unit transmitter for transmission of an error signal to the control unit receiver; and (e) using the error signal in the control unit to adjust the operating frequency of the control unit transmitter into synchronism with the remote unit receiver.

8. A method as set forth in claim 7 wherein the operating frequencies of the remote unit transmitter and receiver are controlled from a single local oscillator.

9. A method as set forth in claim 7 wherein a time advance equal to approximately twice the range time delay between the remote and control units is incorporated into the adjustment of the operating frequency of the control unit transmitter.

10. A method as set forth in claim 7 wherein the signals transmitted between the control and remote units are spread spectrum signals.

* * * * *